(12) United States Patent
Hattori et al.

(10) Patent No.: US 8,878,339 B2
(45) Date of Patent: Nov. 4, 2014

(54) CHIP-COMPONENT STRUCTURE AND METHOD OF PRODUCING SAME

(75) Inventors: Kazuo Hattori, Nagaokakyo (JP); Isamu Fujimoto, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 13/569,454

(22) Filed: Aug. 8, 2012

(65) Prior Publication Data
US 2013/0037911 A1 Feb. 14, 2013

(30) Foreign Application Priority Data
Aug. 10, 2011 (JP) ................. 2011-174500

(51) Int. Cl.
| H01L 21/02 | (2006.01) |
| H01G 4/232 | (2006.01) |
| H01L 49/02 | (2006.01) |
| H01G 2/06 | (2006.01) |
| H05K 3/34 | (2006.01) |
| H01L 23/13 | (2006.01) |
| H01L 23/498 | (2006.01) |
| H01G 4/12 | (2006.01) |
| H05K 1/18 | (2006.01) |

(52) U.S. Cl.
CPC ............ *H01G 4/232* (2013.01); *H01L 28/40* (2013.01); *H01G 2/065* (2013.01); *H05K 3/3442* (2013.01); *H01L 23/13* (2013.01); *H01L 23/49805* (2013.01); *H01G 4/12* (2013.01); *H05K 1/181* (2013.01); *H05K 2201/049* (2013.01); *H05K 2201/09181* (2013.01); *H05K 2201/099* (2013.01); *H05K 2201/10015* (2013.01); *H01L 2924/0002* (2013.01)
USPC .................................. 257/532; 257/E21.011

(58) Field of Classification Search
USPC ................ 257/532, 659, 701, 618, 786, 730, 257/E21.011, E29.342, E21.599, E23.114, 257/E27.048, E23.021
See application file for complete search history.

(56) References Cited

U.S. PATENT DOCUMENTS

| 2003/0128526 A1* | 7/2003 | Sakai et al. ............... 361/736 |
| 2004/0066589 A1 | 4/2004 | Togashi et al. |

(Continued)

FOREIGN PATENT DOCUMENTS

| JP | 07-111380 A | 4/1995 |
| JP | 08-55752 A | 2/1996 |

(Continued)

OTHER PUBLICATIONS

Hattori et al., "Chip-Component Structure," U.S. Appl. No. 13/565,876, filed Aug. 3, 2012.

(Continued)

*Primary Examiner* — Selim Ahmed
*Assistant Examiner* — Moin Rahman
(74) *Attorney, Agent, or Firm* — Keating & Bennett, LLP

(57) ABSTRACT

In a chip-component structure, a monolithic ceramic capacitor is a structure including a predetermined number of substantially flat internal electrodes stacked on each other. An interposer includes a substrate larger than the outer shape of the monolithic ceramic capacitor. The substrate includes a first major surface on which first front electrodes for use in mounting the monolithic ceramic capacitor are disposed and a second major surface on which first back electrodes for use in connecting to an external circuit board are disposed. The interposer includes a depression in its side surface. The depression includes a wall surface on which a connection conductor is disposed. The front surface of the substrate is overlaid with resist films extending along its edges.

5 Claims, 5 Drawing Sheets

(56) References Cited

U.S. PATENT DOCUMENTS

| | | | |
|---|---|---|---|
| 2004/0240146 A1* | 12/2004 | Kayatani et al. | 361/306.3 |
| 2008/0291600 A1* | 11/2008 | Takashima et al. | 361/306.1 |
| 2009/0039507 A1* | 2/2009 | Funaki | 257/737 |
| 2009/0226705 A1* | 9/2009 | Motoki et al. | 428/323 |
| 2010/0123995 A1* | 5/2010 | Otsuka et al. | 361/308.1 |

FOREIGN PATENT DOCUMENTS

| | | |
|---|---|---|
| JP | 08-222831 A | 8/1996 |
| JP | 11-102804 A | 4/1999 |
| JP | 2000-252629 A | 9/2000 |
| JP | 2001-267135 A | 9/2001 |
| JP | 2004-134430 A | 4/2004 |
| JP | 2004-179448 A | 6/2004 |
| JP | 2004-335657 A | 11/2004 |
| JP | 2006-128480 A | 5/2006 |
| JP | 2010-123614 A | 6/2010 |
| TW | 200541430 B | 6/2005 |

OTHER PUBLICATIONS

Official Communication issued in corresponding Japanese Patent Application No. 2011-174500, mailed on Aug. 6, 2013.

Official Communication issued in corresponding Taiwanese Patent Application No. 101122603, mailed on Mar. 27, 2014.

* cited by examiner

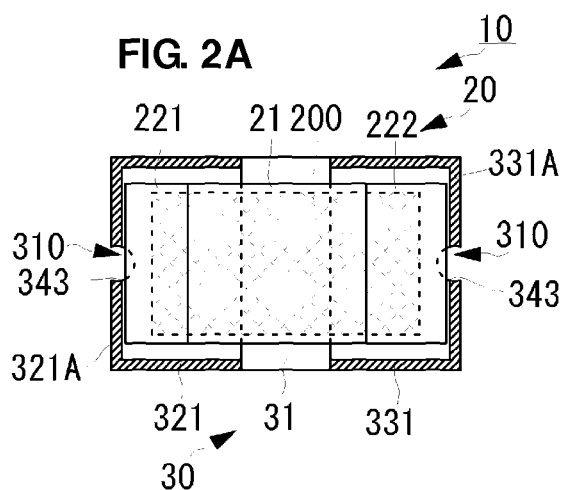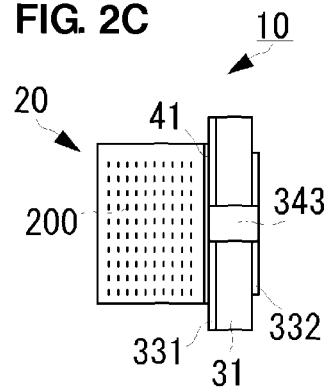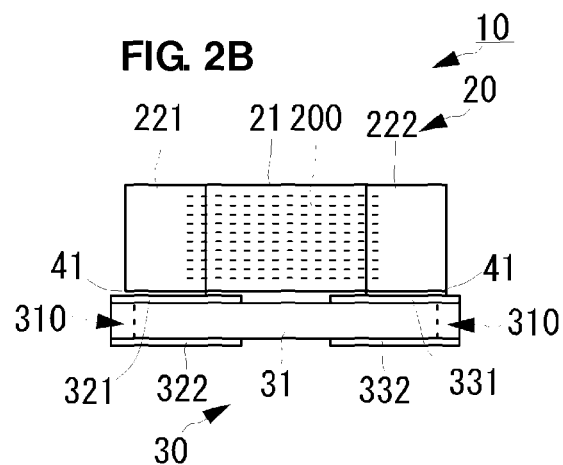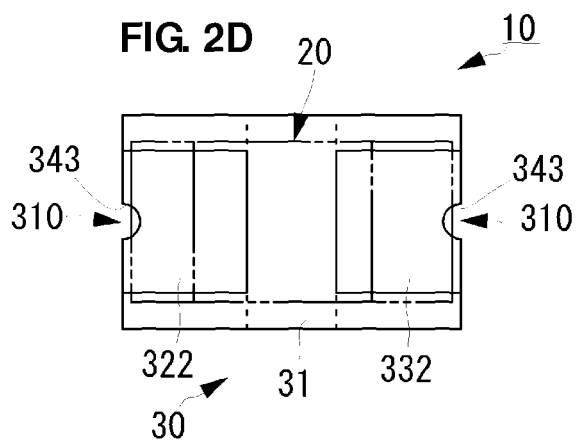

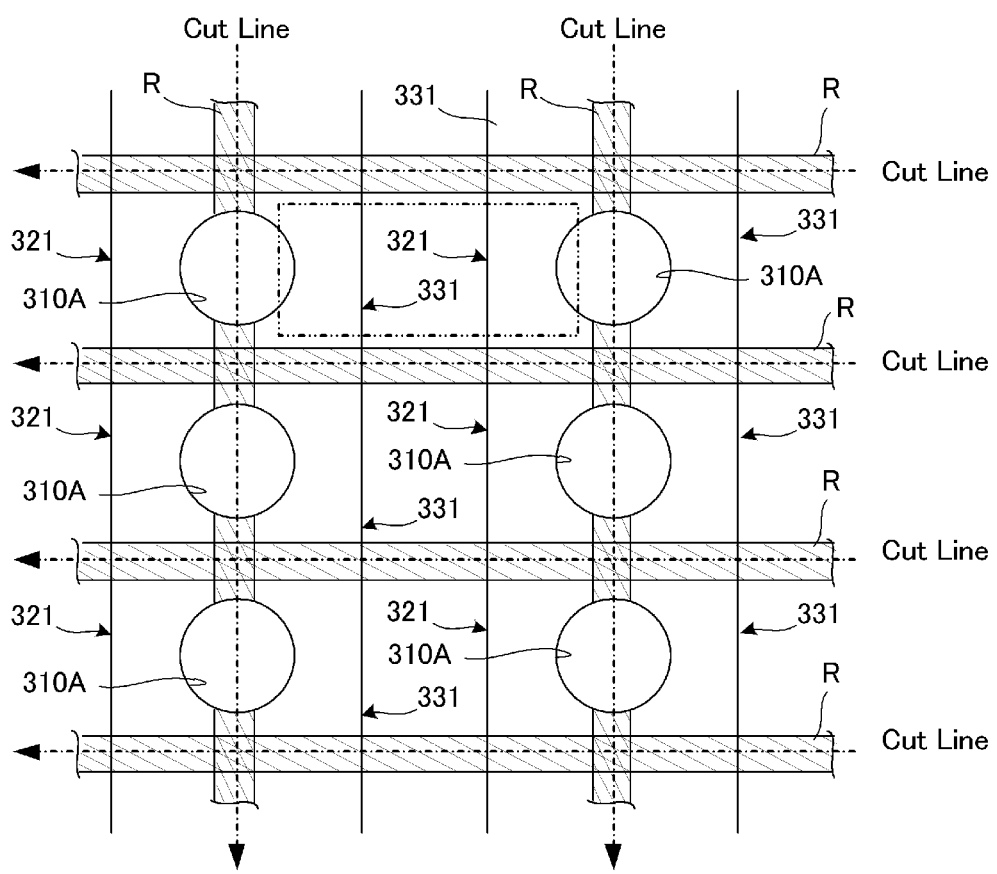

CHIP-COMPONENT STRUCTURE AND METHOD OF PRODUCING SAME

BACKGROUND OF THE INVENTION

1. Field of the Invention

The present invention relates to a chip-component structure and method of producing the same, the chip-component structure including a monolithic ceramic capacitor and an interposer for use in mounting the monolithic ceramic capacitor on a circuit board.

2. Description of the Related Art

Today, chip-components, in particular, small monolithic ceramic capacitors are widely used in mobile terminal devices, such as cellular phones. A monolithic ceramic capacitor includes a substantially rectangular main body, in which internal electrodes and ceramic layers are alternately stacked, and external electrodes on opposite ends of the main body.

Typically, as illustrated in Japanese Unexamined Patent Application Publication No. 8-55752, a monolithic ceramic capacitor is electrically physically connected to a circuit board in a mobile terminal by bonding of mounting lands of the circuit board and external electrodes of the monolithic ceramic capacitor using a bonding agent, such as solder, the external electrodes being directly placed on the mounting lands.

Unfortunately, a monolithic ceramic capacitor may suffer from mechanical distortion caused by a change in a voltage applied to the monolithic ceramic capacitor. Such distortion is transmitted to a circuit board, and the circuit board vibrates. If the circuit board vibrates, a vibrating sound that people can hear is produced.

One example of a structure that addresses this issue is an electronic device described in Japanese Unexamined Patent Application Publication No. 2004-134430. In this configuration, a monolithic ceramic capacitor is not directly mounted on mounting lands and an interposer made of an insulating substrate is used. The interposer includes upper electrodes and lower electrodes, the upper electrodes are bonded to the monolithic ceramic capacitor, and the lower electrodes are bonded to mounting electrodes of the circuit board. The upper electrodes are electrically connected to the respective lower electrode with respective via holes passing through the interposer.

Unfortunately, the electronic device described in Japanese Unexamined Patent Application Publication No. 2004-134430 uses a special structure in which the direction of the arrangement of the lower electrodes of the interposer and the direction of the arrangement of the upper electrodes, that is, the direction of the arrangement of the external electrodes of the monolithic ceramic capacitor and the direction of the arrangement of the mounting electrodes of the interposer to the circuit board are crossed. Accordingly, when the monolithic ceramic capacitor is directly mounted on the circuit board and a vibration sound occurs, if an interposer is used, as illustrated in Japanese Unexamined Patent Application Publication No. 2004-134430, changing land patterns or other suitable changing is required. The changing of land patterns is difficult in a current circuit board which demands high-density packaging. Thus, easier structural designing and mounting are needed.

Typically, an interposer is produced by cutting a stack of a substrate on which electrodes are disposed and a monolithic ceramic capacitor is mounted thereon. The cutting of the portion of the electrodes may cause a burr, which may be an obstruction to soldering for mounting the interposer, and reliability of connection between the interposer and the monolithic ceramic capacitor in mounting may decrease.

SUMMARY OF THE INVENTION

Accordingly, preferred embodiments of the present invention provide a chip-component structure and method of producing the same, the chip-component structure being capable of being produced with easy structural designing and mounting and having mounting strength similar to that of a known typical mounting structure.

According to a preferred embodiment of the present invention, a chip-component structure includes a substrate, a first front electrode, a second front electrode, a first back electrode, a second back electrode, a chip-component, a first connection conductor, and a second connection conductor. The substrate preferably has a substantially rectangular shape and includes parallel or substantially parallel front and back surfaces and four side surfaces perpendicular or substantially perpendicular to the front and back surfaces. The first front electrode is disposed on the front surface of the substrate and is adjacent to a first one of the four side surfaces of the substrate. The second front electrode is disposed on the front surface of the substrate and is adjacent to a second one of the four side surfaces of the substrate. The second side surface is parallel or substantially parallel to the first side surface. The first back electrode is disposed on the back surface of the substrate and is opposed to the first front electrode. The second back electrode is disposed on the back surface of the substrate and is opposed to the second front electrode. The chip-component is mounted on the front surface of the substrate, preferably has a substantially rectangular parallelepiped shape, and includes a first external electrode connected to the first front electrode and a second external electrode connected to the second front electrode. The first connection conductor is disposed in a side portion or in a corner of the substrate and electrically connects the first front electrode and the first back electrode. The second connection conductor is disposed in a side portion or in a corner of the substrate and electrically connects the second front electrode and the second back electrode. Each of the first front electrode and the second front electrode is adjacent to the chip-component mounted on the substrate and is overlaid with a protective film. The protective film is disposed along edges of the substrate partially or completely.

In this configuration, because the protective film (e.g., resist film) is disposed along the edges of each of the first front electrode and the second front electrode, burrs can be prevented from occurring in a cut section in a step of cutting conductive patterns to form the front electrodes in a manufacturing process. This can reduce defects of soldering in mounting the interposer caused by burrs and degradation in reliability of connection between the interposer and the chip-component.

The protective film disposed on the interposer also serves to protect the edges of the chip-component assembly in mounting the chip-component assembly on a circuit board using a surface-mounting machine. Therefore, chipping and cracking of the chip-component assembly can be significantly reduced and prevented, and mounting of the chip-component assembly on the circuit board can be facilitated.

The chip-component structure according to a preferred embodiment of the present invention may further include a first groove and a second groove. The first groove may be disposed in one of the four side surfaces or in a corner defined by the two side surfaces, may be at least partly positioned between the first front electrode and the first back electrode, and may extend along a direction normal to the front and back surfaces. The second groove may be disposed in one of the four side surfaces or in a corner defined by the two side surfaces, may be at least partly positioned between the second front electrode and the second back electrode, and may extend along the direction normal to the front and back surfaces. The first connection conductor may be disposed on an inner peripheral surface of the first groove. The second connection conductor may be disposed on an inner peripheral surface of the second groove.

In this configuration, because each of the grooves is disposed in the side surface or in the corner of the substrate, for example, when the chip-component structure is mounted on a circuit board using a bonding agent, such as solder, the amount of the bonding agent escaping to the groove is increased, and the amount of the wet bonding agent rising to each of the front electrodes can be reduced. As a result, if the chip-component suffers from distortion resulting from a change in an applied voltage, the bonding agent can be made less likely to be attached to the region where the distortion occurs. Because the protective film is disposed along the edges of the front electrode, burrs can be prevented from occurring in a cut section in a step of cutting the conductive patterns to form the front electrodes in a manufacturing process. This can significantly reduce and prevent defects of soldering in mounting the interposer caused by burrs and degradation in reliability of connection between the interposer and the chip-component.

In the chip-component structure according to a preferred embodiment of the present invention, the first front electrode may have a substantially flat shape and may be disposed on the front surface of the substrate such that at least one side surface of the first front electrode is substantially flush with the side surface of the substrate in which the first groove is disposed, and the second front electrode may have a substantially flat shape and may be disposed on the front surface of the substrate such that at least one side surface of the second front electrode is substantially flush with the side surface of the substrate in which the second groove is disposed.

In this configuration, each of the front surfaces is substantially flush with the side surface of the substrate in which the groove is disposed. Therefore, small chip-component structures can be produced.

In the chip-component structure according to a preferred embodiment of the present invention, each of the first front electrode and the second front electrode may include three side surfaces that are substantially flush with the three side surfaces of the substrate, for example.

In this configuration, each of the front electrodes is substantially flush with both the side surface of the substrate in which the groove is disposed and two other side surfaces perpendicular or substantially perpendicular to that side surface. Therefore, smaller chip-component structures can be produced.

In the chip-component structure according to a preferred embodiment of the present invention, the chip-component may be a monolithic ceramic capacitor including a ceramic laminate in which a plurality of ceramic layers and internal electrodes are alternately stacked, the ceramic laminate may include opposite ends, and the first external electrode and the second external electrode may be disposed on the respective opposite ends, and the monolithic ceramic capacitor may be mounted such that the front surface of the substrate is parallel or substantially parallel to the internal electrodes.

In this configuration, restricting the direction in which the monolithic ceramic capacitor is mounted can prevent a bonding agent made of, for example solder, from being attached to a region of the monolithic ceramic capacitor in which distortion caused by a change in an applied voltage is large. In this configuration, because the monolithic ceramic capacitor is mounted on the substantially flat interposer, structural designing and mounting are easy, and mounting strength and electric characteristics similar to those in a known typical mounting structure can be achieved.

The use of the chip-component structure according to a preferred embodiment of the present invention in mounting a monolithic ceramic capacitor on a circuit board can significantly reduce and prevent defects of bonding using a bonding agent in mounting and degradation in reliability of connection between the interposer and the chip-component. The structure can be simple and small, and thus producing the mounting structure on a circuit board is facilitated. In addition, mounting strength and electric characteristics similar to those in a known typical mounting structure can also be achieved.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2D are four views of the chip-component structure according to a preferred embodiment of the present invention.

FIG. 4 is a schematic diagram for describing a producing process in production of the chip-component structure.

DETAILED DESCRIPTION OF THE PREFERRED EMBODIMENTS

Figure 1A:
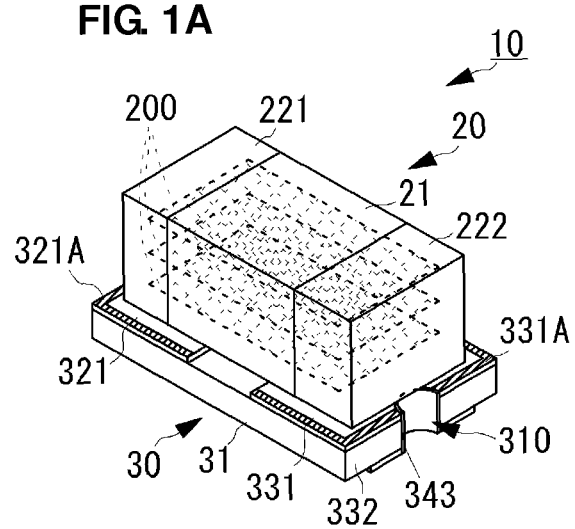
FIG. 1A illustrates an external perspective view of a chip-component structure according to a preferred embodiment of the present invention and FIG. 1B illustrates a perspective view that illustrates a mounted state of the chip-component structure.
Figure 1B:
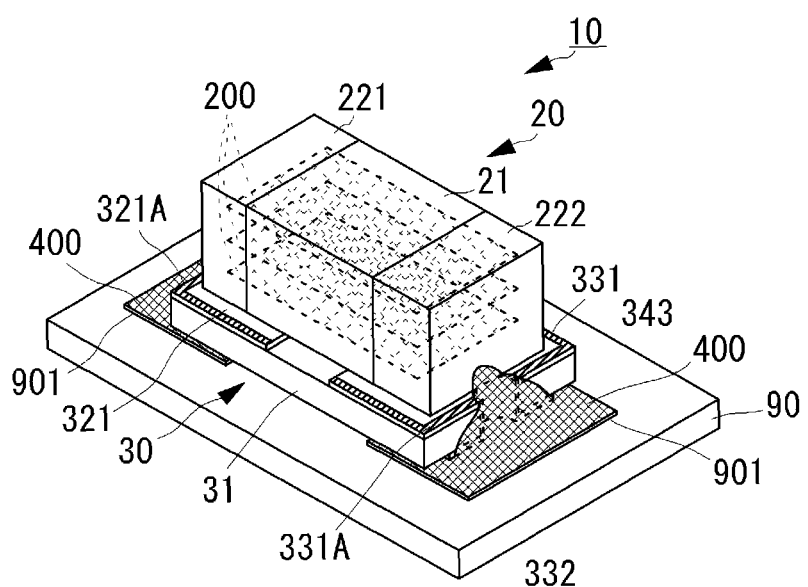
Figure 3A:
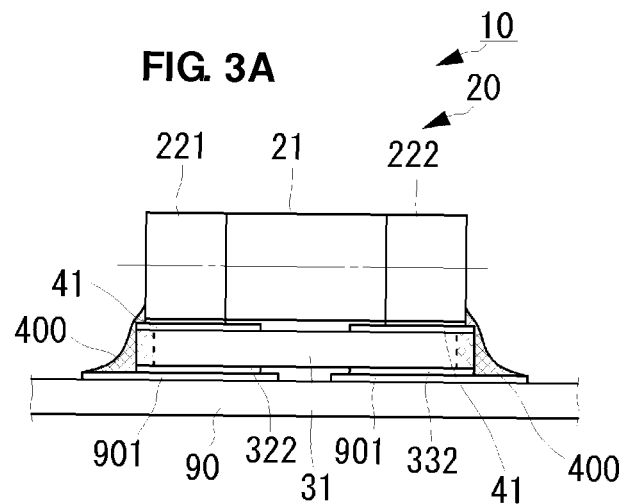
FIGS. 3A and 3B are first and second side views, respectively, that illustrate a mounted state of the chip-component structure according to a preferred embodiment of the present invention.
Figure 3B:
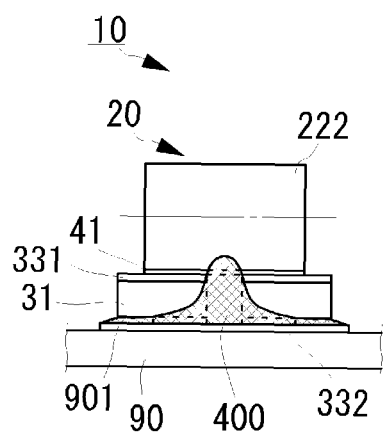

A chip-component structure according to a preferred embodiment of the present invention is described below with reference to the drawings. FIG. 1A is an external perspective view of a chip-component structure 10 according to the present preferred embodiment. FIG. 1B is a perspective view that illustrates a mounted state of the chip-component structure 10. FIGS. 2A to 2D are four views of the chip-component structure 10 according to the present preferred embodiment; FIG. 2A is a plan view, FIG. 2B is a first side view (illustrating a long side), FIG. 2C is a second side view (illustrating a short side), and FIG. 2D illustrates a back surface. FIGS. 3A and 3B are first and second side views, respectively, that illustrate a mounted state of the chip-component structure 10 according to the present preferred embodiment.

The chip-component structure 10 includes a monolithic ceramic capacitor (chip-component) 20 and an interposer 30.

The monolithic ceramic capacitor 20 includes a ceramic laminate 21 preferably having a substantially rectangular parallelepiped shape, for example. The ceramic laminate 21 includes a predetermined multiple number of internal electrodes 200 interleaved with dielectric layers. Each of the internal electrodes 200 has a substantially flat shape. A first external electrode 221 and a second external electrode 222 are disposed on respective opposite ends in the longitudinal direction of the ceramic laminate 21. The first external electrode 221 and the second external electrode 222 are connected to the mutually different internal electrodes 200.

The first external electrode 221 and the second external electrode 222 not only are disposed on respective opposite end surfaces in the longitudinal direction but also extend from the opposite end surfaces toward opposite end surfaces in the transverse direction (direction substantially perpendicular to the longitudinal direction) and toward the top surface and the bottom surface. The first external electrode 221 and the second external electrode 222 are subjected to predetermined metal plating to facilitate the resistance to corrosion and the conductivity.

Examples of the dimensions of the length (longitudinal direction) by width (transverse direction) of the monolithic ceramic capacitor 20 having the above-described configuration can include approximately 3.2 mm by approximately 1.6 mm, approximately 2.0 mm by approximately 1.25 mm, approximately 1.6 mm by approximately 0.8 mm, approximately 1.0 mm by approximately 0.5 mm, and approximately 0.6 mm by approximately 0.3 mm, for example.

The interposer 30 includes a substrate 31. The substrate 31 can be made of an insulating resin and have a thickness of approximately 0.5 mm to approximately 1.0 mm, for example. The substrate 31 preferably has a substantially rectangular shape similar to the monolithic ceramic capacitor 20 when seen in the direction substantially perpendicular to a first major surface and a second major surface (in the direction normal thereto) of the substrate 31. The first major surface and the second major surface are flat-shaped surfaces.

The substrate 31 is larger than the monolithic ceramic capacitor 20 in both the longitudinal direction and the transverse direction when seen from the normal direction. For example, the substrate 31 may have a size at which it extends beyond the length and width of the monolithic ceramic capacitor 20 by a predetermined ratio or a shape that extends beyond the perimeter of the monolithic ceramic capacitor 20 by a predetermined length.

In the following description, the side surfaces extending along the transverse direction of the substrate 31 are referred to as transverse side surfaces, and the side surfaces extending along the longitudinal direction of the substrate 31 are referred to as longitudinal side surfaces. The front surface of the substrate 31 on which the monolithic ceramic capacitor 20 is mountable is referred to as the first major surface, and the back surface of the substrate 31 parallel or substantially parallel to the first major surface and mountable on an external circuit board 90 is referred to as the second major surface.

A depression (groove) 310 is disposed in a substantially central location in the transverse direction in each of the transverse side surfaces of the substrate 31. The depression 310 preferably has a substantially arc shape having a predetermined diameter when seen in the normal direction and passes through the thickness direction of the substrate 31. The depression 310 is in contact with an electrode disposed on each of the first major surface and the second major surface of the substrate 31, and that electrode is described below.

Each of the depressions 310 includes a substantially arc intermediate section directly underneath the bottom of the first external electrode 221 or that of the second external electrode 222. In other words, each of the depressions 310 is disposed such that its substantially arc intermediate section overlaps the monolithic ceramic capacitor 20 when seen in the normal direction. In another expression, the monolithic ceramic capacitor 20 is mounted such that each of the first external electrode 221 and the second external electrode 222 at the opposite ends thereof overlaps the intermediate section of the corresponding depression 310.

A first front electrode 321 and a second front electrode 331 are disposed on the first major surface of the substrate 31. Each of the first front electrode 321 and the second front electrode 331 has a substantially flat shape and includes substantially oblong front and back surfaces having long sides and short sides. The monolithic ceramic capacitor 20 is mounted on the front surface of each of the first front electrode 321 and the second front electrode 331, and the back surface thereof is bonded to the substrate 31. One side surface of the long sides of each of the first front electrode 321 and the second front electrode 331 matches the corresponding transverse side surface of the substrate 31. The first front electrode 321 and the second front electrode 331 are spaced apart from each other in the longitudinal direction of the substrate 31.

A linear resist film (protective film) 321A is disposed either partially or entirely on the edges of the front surface of the first front electrode 321 along the transverse side surfaces and the longitudinal side surfaces of the substrate 31. Similarly, a linear resist film 331A is disposed partially or entirely on the edges of the front surface of the second front electrode 331 along the transverse side surface and the longitudinal side surface of the substrate 31. Each of the first front electrode 321 and the second front electrode 331 is formed preferably by cutting of one electrode pattern subjected to electrode surface processing by electrolytic plating in a producing process. Each of the resist films 321A and 331A functions to prevent burrs from occurring in a cut section in cutting the electrode pattern in the producing process.

The thickness of each of the resist films 321A and 331A can be changed as appropriate and may preferably be about 15 µm or more, for example. The resist films 321A and 331A, which are provided to prevent burrs, may be replaced with other resin films capable of reducing the occurrence of burrs.

The shape of each of the first front electrode 321 and the second front electrode 331 may be set in accordance with the shape of each of the external electrodes of the monolithic ceramic capacitor 20. In this way, the advantageous effect of so-called self-alignment is obtainable in mounting the monolithic ceramic capacitor 20 on the interposer 30, thus enabling the monolithic ceramic capacitor 20 to be mounted in a desired location on the interposer 30. This advantageous effect enables the advantageous effect of preventing wet solder from rising from the external circuit board 90 with reliability.

A first back electrode 322 and a second back electrode 332 are disposed on the second major surface of the substrate 31. The first back electrode 322 is opposed to the first front electrode 321. The second back electrode 332 is opposed to the second front electrode 331. Each of the first back electrode 322 and the second back electrode 332 extends along the transverse direction and is not provided in sections extending from the opposite ends by predetermined distances. The shape of each of the first back electrode 322 and the second back electrode 332 may be set in accordance with the shape of a mounting land 901 of the external circuit board 90 on which the chip-component structure 10 is mounted.

A connection conductor 343 is disposed on the inner peripheral surface of each of the depressions 310. The connection conductor 343 enables electrical connection between the first front electrode 321 and the first back electrode 322, and the other connection conductor 343 enables electrical connection between the second front electrode 331 and the second back electrode 332.

As illustrated in FIGS. 1A to 3B, the monolithic ceramic capacitor 20 is mounted on the interposer 30 having the above-described structure such that the substantially flat surfaces of the internal electrodes 200 are parallel or substantially parallel to the first major surface and the second major surface of the interposer 30.

The first external electrode 221 of the monolithic ceramic capacitor 20 is mounted on the first front electrode 321 of the interposer 30. The second external electrode 222 of the monolithic ceramic capacitor 20 is mounted on the second front electrode 331 of the interposer 30. At this time, bonding between the first external electrode 221 and the first front electrode 321 and bonding between the second external electrode 222 and the second front electrode 331 are achieved by remelting of metal plating (e.g., tin plating) of the first external electrode 221 and that of the second external electrode 222 on the mounting surface side of the first external electrode 221 and that of the second external electrode 222. This forms a bonding layer 41 between the first external electrode 221 and the first front electrode 321 and between the second external electrode 222 and the second front electrode 331, and the bonding layer 41 enables electrical and mechanical connection therebetween.

When metal plating similar to that in the external electrodes is performed on the first front electrode 321 and the second front electrode 331 in advance, the metal plating on the first front electrode 321 and the second front electrode 331 is contained in the connection. The monolithic ceramic capacitor 20 and the interposer 30 may be bonded to each other using a bonding agent (e.g., solder) without the use of the metal plating on the interposer 30.

The chip-component structure 10 formed in the above-described way is mounted on the external circuit board 90, as illustrated in FIGS. 1B, 3A and 3B. At this time, the chip-component structure 10 is mounted such that the first back electrode 322 and the second back electrode 332 are connected to the respective mounting lands 901 of the external circuit board 90. A bonding agent 400 (e.g., solder) is preferably used in the connection between the first back electrode 322 and the second back electrode 332 and their respective mounting lands 901.

Such bonding using the bonding agent 400 is made such that a fillet is formed from at least the mounting land 901 of the external circuit board 90 to the connection conductor 343 of the depression 310 of the interposer 30. The fillet is significantly advantageous because it can prevent the chip-component structure 10 from floating up at the time of mounting, can ensure sufficient bonding strength, and allows a user to visually check a defect of the bonding state. The bonding agent 400 may preferably be solder. Alternatively, it may be made of a material other than solder as long as the bonding agent has appropriate wettability and conductivity.

In the case of bonding using the bonding agent 400, if the bonding agent 400 is supplied in a large amount, the wet bonding agent 400 may rise to the upper surface side of the interposer 30 along the connection conductor 343 beyond the fillet on the connection conductor 343.

However, in the configuration according to the present preferred embodiment, because the opposite ends of the interposer are spaced apart from the opposite ends of the monolithic ceramic capacitor 20, even if the wet bonding agent 400 rises to the upper surface side of the interposer 30, it does not easily reach to the first external electrode 221 or the second external electrode 222. Accordingly, the amount of the wet bonding agent 400 rising to the major surfaces (opposite end surfaces in the longitudinal direction of the monolithic ceramic capacitor 20) of each of the first external electrode 221 and the second external electrode 222 can be reduced.

In addition, because the interposer 30 includes the depressions 310 positioned directly underneath the bottom of the monolithic ceramic capacitor 20 and the connection conductor 343 is disposed on only each of the depressions 310, the bonding agent 400 moves on the bottom of the monolithic ceramic capacitor 20 in the course of rising toward the front surface of the interposer 30, and thus the amount of the wet bonding agent 400 rising to the front surface of each of the first external electrode 221 and the second external electrode 222 can be further reduced.

Accordingly, the use of the configuration according to the present preferred embodiment can significantly reduce the amount of the wet solder rising to the front surface of each of the first external electrode 221 and the second external electrode 222 when approximately the amount of the bonding agent 400 that would be used in directly mounting the monolithic ceramic capacitor 20 on the mounting lands 901 of the external circuit board 90 is used.

A non-limiting example of a method of producing the above-described chip-component structure 10 will now be described below.

FIG. 4 is a schematic diagram for describing a producing process in production of the chip-component structure 10. A conductive pattern 300 containing silver and having a strip that is long in one direction is formed on an insulating substrate. The conductive pattern 300 will be cut into small pieces forming the first front electrodes 321 and second front electrode 331 in finished products.

The conductive pattern 300 is overlaid with a metallic film formed by electrolytic plating. After that, substantially circular through holes 310A (depressions 310 in finished products) are formed in the conductive pattern 300 in a substantially longitudinal direction at predetermined intervals. Conductive paste predominantly composed of copper or silver is applied on the through holes 310A to form metal plating (connection conductors 343 in finished products) on the inner wall of each of the through holes 310A.

Green resists R are applied on the conductive pattern 300 along the center lines. The green resists R are also applied between the through holes 310A formed in the conductive pattern 300 along the width direction. Then, the first external electrodes 221 and the second external electrodes 222 are connected to the conductive pattern 300 (first front electrodes 321 and second front electrodes 331), and the monolithic ceramic capacitors 20 are mounted as indicated by the dotted lines in FIG. 4. Then, the composite is cut along the applied green resists R into the chip-component structures 10.

At the time of cutting, burrs occurring in the cut sections of the conductive pattern 300 can be prevented by the green resists R. Thus, the chip-component structure 10 being a finished product has no burrs in the first front electrode 321 and the second front electrode 331. Accordingly, the possibilities that reliability of connection between the interposer and the chip-component will degrade and that the strength of bonding using the bonding agent 400 will decrease can be reduced.

A specific configuration of the chip-component structure 10 and a specific method of producing the same can be altered in designing as appropriate. The advantageous effects described in the above preferred embodiment are merely listed as the most suitable ones stemming from preferred embodiments of the present invention, and the advantageous effects of preferred embodiments of the present invention are not limited to the ones described in the above-described preferred embodiment.

Figure 5A:
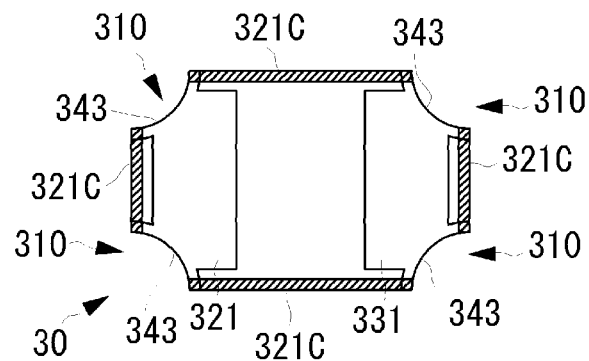
FIGS. 5A and 5B are top views that illustrate other examples of the chip-component structure.
Figure 5B:
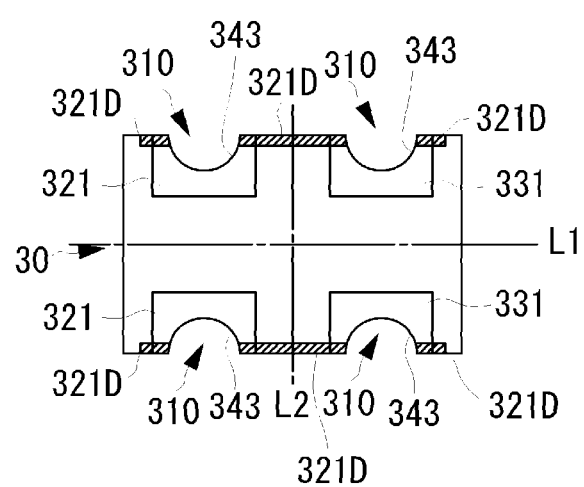

For example, the locations of the depressions and resist films may be changed as appropriate. FIGS. 5A and 5B are top views that illustrate other examples of the chip-component structure 10. FIGS. 5A and 5B illustrate views corresponding to FIG. 2A. For the sake of the description, the monolithic ceramic capacitor 20 is not illustrated in FIGS. 5A and 5B.

FIG. 5A illustrates the depressions 310 disposed on the four corners defined by the side surfaces of the substrate 31. The connection conductor 343 is disposed on the inner peripheral surface of each of the depressions 310. A resist film 321C is disposed on each of the edges extending along the transverse side surfaces and the longitudinal side surfaces of the substrate 31. When the depressions 310 are provided as illustrated in FIG. 5A, the resist films 321C can prevent burrs from occurring in the depressions 310 in the first front electrode 321 and the second front electrode 331.

FIG. 5B illustrates the four depressions 310 disposed in the side surfaces extending along the longitudinal direction of the substrate 31. The four depressions 310 are disposed in the locations at which they are substantially symmetric with respect to the medians L1 and L2 when seen from the normal direction. The first front electrodes 321 and the second front electrodes 331 surround their respective depressions 310. The first front electrodes 321 include a pair of conductive patterns, and the second front electrodes 331 include a pair of conductive patterns. A resist film 321D is disposed on each of the edges extending along the longitudinal side surfaces of the substrate 31. When the depressions 310 are provided as illustrated in FIG. 5B, the resist films 321D can prevent burrs from occurring in the sections of the connection conductors 343, the first front electrodes 321, and the second front electrodes 331.

The resist film 321A illustrated in FIG. 2A may alternatively be disposed on only a portion of the transverse side surfaces of the substrate 31 containing the depressions 310. The connection conductor 343 illustrated in FIG. 2A is disposed on the side wall surface of each of the depressions 310. Alternatively, the depressions 310 may not be provided, and the connection conductors 343 may be disposed on the side surfaces of the substrate 31.

It should be noted that, as used herein, the term "on" inclusively includes "directly on" (no intermediate materials, elements or space disposed therebetween) and "indirectly on" (intermediate materials, elements or space disposed therebetween).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A chip-component structure comprising:
   a substrate including parallel or substantially parallel front and back surfaces and four side surfaces extending is a direction perpendicular or substantially perpendicular to the front and back surfaces, the front and back surfaces being opposed to each other in the direction perpendicular or substantially perpendicular to the front and back surfaces;
   a first front electrode disposed on the front surface of the substrate and adjacent to a first one of the four side surfaces of the substrate;
   a second front electrode disposed on the front surface of the substrate and adjacent to a second one of the four side surfaces of the substrate, the second side surface being parallel or substantially parallel to the first side surface;
   a first back electrode disposed on the back surface of the substrate and opposed to the first front electrode;
   a second back electrode disposed on the back surface of the substrate and opposed to the second front electrode;
   a chip-component mounted on the front surface of the substrate, including a first external electrode connected to the first front electrode and a second external electrode connected to the second front electrode;
   a first connection conductor disposed in a side portion or in a corner of the substrate and electrically connecting the first front electrode and the first back electrode; and
   a second connection conductor disposed in a side portion or in a corner of the substrate and electrically connecting the second front electrode and the second back electrode; wherein
   each of the first front electrode and the second front electrode is overlaid with a protective film, and the protective film is disposed partially or completely on edges of the first front electrode and the second front electrode along at least one of the side surfaces.

2. The chip-component structure according to claim 1, further comprising:
   a first groove that is disposed in one of the four side surfaces or in a corner defined by the two side surfaces, that is at least partly positioned between the first front electrode and the first back electrode, and that extends along a direction normal to the front and back surfaces; and
   a second groove that is disposed in one of the four side surfaces or in a corner defined by the two side surfaces, that is at least partly positioned between the second front electrode and the second back electrode, and that extends along the direction normal to the front and back surfaces; wherein
   the first connection conductor is disposed on an inner peripheral surface of the first groove; and
   the second connection conductor is disposed on an inner peripheral surface of the second groove.

3. The chip-component structure according to claim 2, wherein the first front electrode has a substantially flat shape and is disposed on the front surface of the substrate such that at least one side surface of the first front electrode is flush or substantially flush with the side surface of the substrate in which the first groove is disposed; and
   the second front electrode has a substantially flat shape and is disposed on the front surface of the substrate such that at least one side surface of the second front electrode is flush or substantially flush with the side surface of the substrate in which the second groove is disposed.

4. The chip-component structure according to claim 3, wherein each of the first front electrode and the second front electrode includes three side surfaces that are flush or substantially flush with the three side surfaces of the substrate.

5. The chip-component structure according to claim 1, wherein the chip-component is a monolithic ceramic capacitor including a ceramic laminate in which a plurality of ceramic layers and internal electrodes are alternately stacked, the ceramic laminate includes opposite ends, and the first external electrode and the second external electrode are disposed on the respective opposite ends, and
   the monolithic ceramic capacitor is mounted such that the front surface of the substrate is parallel or substantially parallel to the internal electrodes.

* * * * *